United States Patent [19]

Heremans

[11] Patent Number: 5,173,758
[45] Date of Patent: Dec. 22, 1992

[54] HALL GENERATOR WITH FOUR ARMS

[75] Inventor: Joseph P. Heremans, Troy, Mich.

[73] Assignee: General Motors Corporation, Detroit, Mich.

[21] Appl. No.: 783,596

[22] Filed: Oct. 28, 1991

[51] Int. Cl.$^5$ .......................................... H01L 27/22
[52] U.S. Cl. ................................. 257/188; 338/32 R; 338/32 H; 324/252; 324/207.21; 257/421; 257/425; 257/424
[58] Field of Search .................... 357/27, 25, 22 I, 16, 357/15; 338/32 H, 32 R; 324/252, 207.21

[56] References Cited

U.S. PATENT DOCUMENTS

| | | | |
|---|---|---|---|
| 3,617,975 | 11/1971 | Wieder | 338/32 |
| 4,028,718 | 6/1977 | Migitaka et al. | 357/27 |
| 4,315,273 | 2/1982 | Yamamoto et al. | 357/27 |
| 4,884,119 | 11/1989 | Miller | 357/4 X |
| 4,926,154 | 5/1990 | Heremans et al. | 338/32 R |
| 4,939,456 | 7/1990 | Morelli et al. | 324/207.21 |
| 4,972,241 | 11/1990 | Fukuda et al. | 357/27 |
| 4,978,938 | 12/1990 | Partin et al. | 338/32 R |

FOREIGN PATENT DOCUMENTS 1325186  3/1963  France ................................. 357/27

OTHER PUBLICATIONS

H. H. Wieder, "Anomalous Transverse Magnetoresistance of InSb Films," *Journal of Applied Physics*, vol. 40, No. 8, Jul. 1969, pp. 3320-3325.

T. Nakamura & K. Maenaka, "Integrated Magnetic Sensors," *Sensors and Actuators*, A21-A23 (1990), pp. 762-769.

D. L. Endsley, W. W. Grannemann & L. L. Rosier, "Four-Terminal Analysis of the Hall Generator," *IRE Transactions on Electron Devices*, May 1961, pp. 220-224.

"GaAs Applications in Automotive Electronics," *BIS Strategic Decisions*, Mar. 1991, pp. 1-21.

H. W. Wieder, "Transport coefficients of InAs epilayers," *Applied Physics Letters*, vol. 25, No. 4, 15 Aug. 1974, pp. 206-208.

H. P. Baltes & R. S. Popovic, "Integrated Semiconductor Magnetic Field Sensors," *Proceedings of the IEEE*, vol. 74, No. 8, Aug. 1986, pp. 1107-1132.

*Siemens Magnetic Sensors Data Book*, Siemens Aktiengesellschaft, pp. 6 & 49, 1989, Munich, Germany.

Y. Sugiyama, H. Soga & M. Tacano, "Highly-Sensitive Hall Element with Quantum-Well Superlattice Structures," *Journal of Crystal Growth* 95 (1989), pp. 394-397.

S. Kataoka, "Recent Development of Magnetoresistive Devices and Applications," *Circulars of the Electrotechnical Laboratory No.* 182, Agency of Industrial Science and Technology, Tokyo (Dec. 1974), pp. 1-52.

*Primary Examiner*—William Mintel
*Attorney, Agent, or Firm*—Robert J. Wallace

[57] ABSTRACT

A Hall generator includes a substrate body of single crystalline semi-insulating gallium arsenide having a surface. A thin layer, no greater than about 5 micrometers in thickness, of single crystalline indium arsenide is on the surface of the body and is in the form of four arms joined at a common point to form a cross. A separate metal contact is on each of the arms at the free end thereof. An accumulation layer is adjacent the outer surface of the indium arsenide layer and extends along the entire surface of the indium arsenide layer between the contacts. The accumulation layer is effective to provide a magnetic sensitivity and range of operating temperatures as if the indium arsenide layer was much thinner and had a much higher electron density and electron mobility. Electrical devices, such as field effect transistors, may be formed in the body and the surface and electrically connected to the contacts of the Hall generator in a desired circuit.

21 Claims, 5 Drawing Sheets

HALL GENERATOR WITH FOUR ARMS

FIELD OF THE INVENTION

The present invention relates to a Hall generator and, more particularly, to a Hall generator having a high sensitivity over a wide range of temperatures and which can be incorporated in an integrated circuit.

BACKGROUND OF THE INVENTION

Electronic devices capable of sensing magnetic field strength have become increasingly important in many fields of industry. The simplest of such devices is the magnetoresistor, which consists of a material whose resistance varies as a function of an applied magnetic field. When used in conjunction with a permanent magnet, for instance, magnetoresistors can be made into accurate position sensors. Such a device is shown in U.S. Pat. No. 4,939,456 (Donald T. Morelli et al., issued Jul. 3, 1990) entitled, "Position Sensor Including a Thin Film Indium Arsenide Magnetoresistor on a Permanent Magnet."

Magnetoresistors have a resistance that increases roughly quadratically with an applied magnetic field. It is desirable that the magnetoresistor have a high resistance. To achieve this characteristic, magnetoresistors have been made of a thin film of a suitable material on a substrate of an insulating or semi-insulating material. To achieve high electron mobility, a material having a high electron mobility, such as indium arsenide, has been used as the magnetoresistor material. Also, as described in U.S. Pat. No. 4,926,154 (Joseph P. Heremans et al., issued May 15, 1990) entitled, "Indium Arsenide Magnetoresistor," thin films, 5 micrometers or less, of indium arsenide having an accumulation layer along its surface with the areal density of the surface accumulation layer being substantially larger, at least an order of magnitude larger, than the areal density of the bulk of the film, provide excellent magnetoresistor materials. The electron accumulation layer is effective to provide a magnetic sensitivity and range of operating temperatures as if the indium arsenide thin film was apparently much thinner and had a much higher electron density and electron mobility.

Another type of magnetic sensitive device which is widely used is a Hall generator. For example, see the article of D. L. Endsley et al. entitled, "Four-Terminal Analysis of the Hall Generator," published in IRE TRANSACTIONS ON ELECTRON DEVICES, May 1961, pgs. 220–224. Hall generators give a voltage output that vary essentially linearly in a magnetic field. They are also sensitive to the polarity of the field, and at substantially low fields are more sensitive than a magnetoresistor. Therefore, Hall generators are more widely used when the polarity, as well as the sensitivity, of the magnetic field is to be measured.

The output voltage from a single Hall generator is proportional to the inverse of the carrier density per unit area of the sensor, and also to the amount of current that can be sent to the sensor. The first condition favors a semiconductor with a low carrier density. The second condition requires a good electrical conductivity. These two conditions can only be met simultaneously in a high-mobility semiconductor material. Also, sensors used in severe temperature extremes, such as those experienced near an automobile engine, require a material whose sensitivity to a magnetic field is not dependent on temperature. In principle, this can be achieved by doping the semiconductor materials to obtain a large carrier density. This solution is commonly used in magnetoresistors. However, in a Hall generator, contrarily to the case of a magnetoresistor, large carrier densities lead to a lower signal output.

Hall generators have been made from silicon. However, such Hall generators have a very low output. Although usable devices have been made by providing on-chip amplification, this requires high-gain amplifiers and this limits the usable bandwidth. The silicon technology further restricts the temperature range over which each device can work. Bulk indium arsenide and bulk indium antimonide have been used to make the most sensitive Hall generators. However, the devices are not only expensive, but are also not sensitive enough for widespread applications. Gallium arsenide with a few thousand Angstrom thick n-type conductivity doped surface layer made by ion implantation or epitaxial growth on GaAs or AlGaAs buffer layer is used to make inexpensive discrete devices that can operate at higher temperatures. However, this device lacks sensitivity because of the low mobility of gallium arsenide compared to indium arsenide and indium antimonide. Although on-chip amplification can be used and is being developed for gallium arsenide Hall generators, these devices still suffer from the lower output of the Hall generator itself. The amplifiers require high gains and this can only be achieved at the expense of band width. In automotive applications, the high frequency cut-off of these sensors can be too low.

SUMMARY OF THE INVENTION

The present invention is directed to a Hall generator which is highly sensitive to magnetic fields over a wide range of temperatures. The Hall generator comprises a thin, not more than about 5 micrometers thick and preferably less than 2 micrometers thick, layer of single crystalline indium arsenide on a surface of a body of a semiconductor material which is at least semi-insulating. The indium arsenide layer has four arms which are joined at a common point, and a separate conductive contact is on the free end of each of the arms. The indium arsenide layer comprises an electron accumulation layer adjacent an outer surface thereof which extends across the entire surface of the indium arsenide layer between contacts thereof. The accumulation layer has an electron density at least an order of magnitude higher than the average electron density of the indium arsenide layer and an electron mobility comparable to the average electron mobility of the indium arsenide layer. The thermal stability of this device is equivalent to that of an indium arsenide device with much higher electron density while the magnetic sensitivity is equivalent to that of a device made from a much thinner indium arsenide layer.

The body may have in and along the surface thereof other electrical devices, such as field effect transistors, which form a desired circuit and are connected to the Hall generator to provide on-chip integrated amplification and signal processing.

The invention will be better understood from the following more detailed description taken with the accompanying drawings.

The drawings are not necessarily drawn to scale.

DETAILED DESCRIPTION

Figure 1:
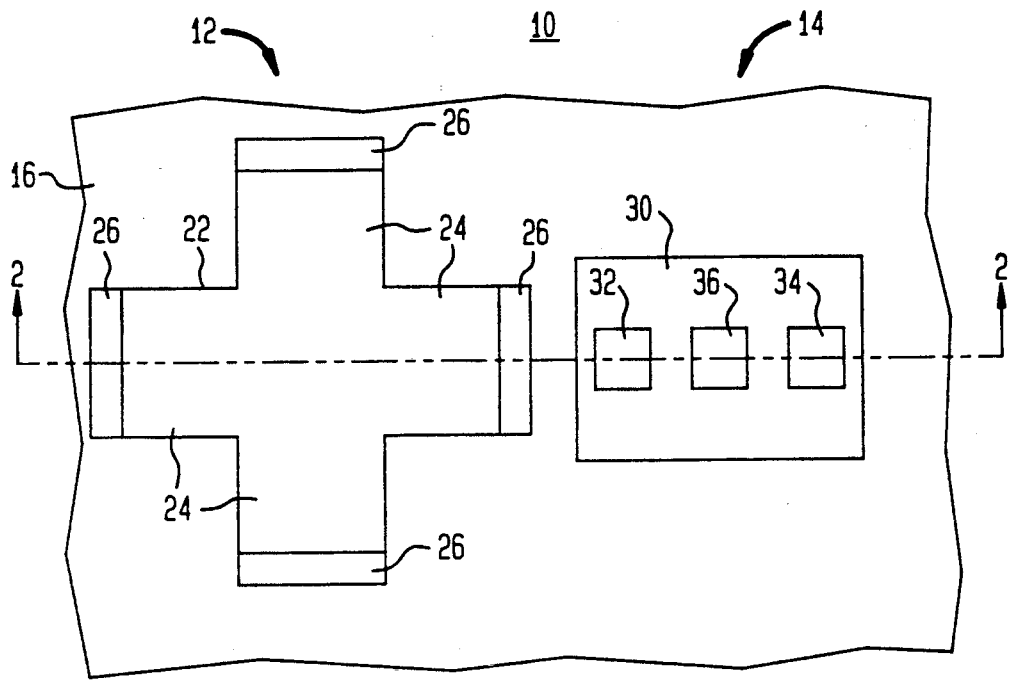
FIG. 1 is a top plan view of the Hall generator of the present invention as part of an integrated circuit.
Figure 2:
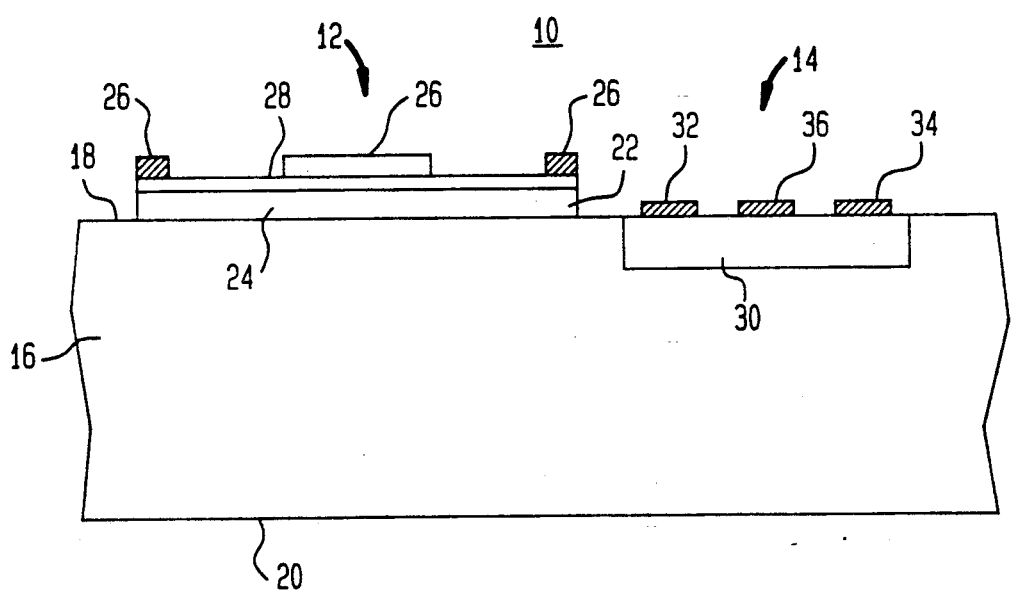
FIG. 2 is a sectional view taken along line 2—2 of FIG. 1.

Referring to FIGS. 1 and 2, there is shown a top plan view (FIG. 1) and a cross-sectional view (FIG. 2) of an integrated circuit 10 which includes a Hall generator 12 in accordance with the present invention and a field effect transistor (FET) 14. Integrated circuit 10 comprises a substrate body 16 of a semi-insulating semiconductor material, such as iron doped gallium arsenide or indium phosphide, having opposed surfaces 18 and 20. The Hall generator 12 is formed on the surface 18 of the body 12, and the FET 14 is formed in the body 12 along the surface 18. Although only one FET 14 is shown, a plurality of such devices along with other electrical devices can be formed in the body 12 and electrically connected in a desired circuit. The circuit formed by the electrical devices can be used to control the Hall generator 12 or treat the output of the Hall generator 12, such as by amplifying the output.

The Hall generator 12 comprises a layer 22 of undoped single crystalline indium arsenide (InAs) on the surface 18 of the body 16. As shown in FIG. 1, the layer 22 is in the form of four arms 24 which are joined and extend from a common point so as to form a cross. A separate conductive contact 26 is on each of the arms 24 at the free end thereof. The layer 22 is thin, of a thickness no greater than about 5 micrometers and preferably no greater than about 3 micrometers. The bulk density of the layer 22 is generally moderate, of the order of $5 \times 10^{16}$ electrons per cubic centimeter of preferably lower. The layer 22 should be of good crystalline quality so as to have a high average electron mobility, 10,000 to 32,000 centimeters per volt per second at room temperature, even though some decay of the mobility of the electrons close to the body interface is inevitable in practice and can be tolerated. Along the surface of the layer 22 is an electron accumulation layer 28 which extends across the entire surface of the layer 22 between the contacts 26. The electron accumulation layer has an electron density at least an order of magnitude and typically two orders of magnitude ($1 \times 10^{18}$ cm$^{-3}$) higher than the average electron density of the indium arsenide layer 22 and an electron mobility significantly comparable to the average electron mobility of the layer 22. Thus, the electron accumulation layer 28 is effective to provide a range of operating temperatures as if the indium arsenide layer 22 were apparently much thinner and had a much higher electron density while maintaining as good an electron mobility as the bulk of the undoped film. Because the accumulation layer is very thin (100-500 angstroms), the total electron density per unit area of the Hall generator is kept moderately low (2 to $7 \times 10^{12}$ cm$^2$). This results in a large Hall effect and provides a good magnetic sensitivity, which would otherwise not be achieved in an active layer with such a high doping density ($1 \times 10^{18}$ cm$^3$). The contacts 26 are of a metal or combination of metals which make good ohmic contact with the indium arsenide, such as an eutectic of gold and germanium.

The FET 14 comprises a region 30 of n-type conductivity in the body 12 along the surface 18. A pair of contacts 32 and 34 are spaced apart on the region 30. The contacts 32 and 34 are of any conductive material, such as a metal, which makes good ohmic contact with the gallium arsenide of the region 30. The contacts 32 and 34 form the source and drain of the FET. Between the contacts 32 and 34 and on the region 30 is a gate contact 36. The gate contact 36 is of a metal which forms a Schottky barrier junction with the gallium arsenide of the region 30 to form the gate of the FET 14. One or more of the contacts 32, 34 and 36 is electrically connected to one or more of the contacts 26 of the Hall generator 12 to form a desired circuit. The connections can be made by wires or, more preferably, by a pattern of a conductive material (not shown) on the surface 18 of the body 12.

To make the integrated circuit 10, a layer of single crystalline indium arsenide is deposited over the entire surface 18 of the body 16. This is achieved using metal organic chemical vapor deposition (MOCVD) technique. In this technique, a metal organic gas containing indium, such as ethyldiethylindium, and a gas containing arsenic, such as arsine, are fed into a chamber containing the body. The substrate and gases are heated to a deposition temperature of about 450° C., at which the gases decompose and react to form indium arsenide. The indium arsenide then deposits on the body. A second preferred growth technique is molecular beam epitaxy (MBE). In this technique, the substrate is introduced in a growth chamber which is evacuated to ultra-high vacuum, typically $10^{-10}$ torr. Beams of indium and arsenic atoms (or dimers, trimers or tetramers), generated by shuttered crucibles, are then made to impinge on the substrate. The indium arsenide then condenses as a compound from the impinging beams. Other growth techniques, such as vapor-phase or liquid-phase epitaxy can also be used to produce the desired indium arsenide films.

A masking layer is then formed over the area of the indium arsenide layer which is to form the Hall generator using photolithographic techniques. The uncovered portion of the indium arsenide layer is then removed with any well-known suitable etchant leaving the layer 26 of the Hall generator 12 on the body 16 in the form of a mesa. The contacts 28 are applied to the layer 26 by any well-known deposition technique, such as vacuum evaporation.

The field effect transistor 14 is made by doping an area of the body 16 with an n-type impurity, such as by ion implantation, to form the region 30. A metal or group of metals which is capable of forming an ohmic contact with the body 16 is deposited on the surface of the region 30 and defined to form the source and drain contacts 32 and 34. A metal or group of metals capable of forming a Schottky barrier junction with the body 16 is then deposited on the surface of the region 30 and defined to form the gate contact 36. Other transistors, such as bipolar transistors having AlGaAs/GaAs heterojunctions or field-effect transistors, can also be fabricated in the GaAs substrate as needed.

The Hall generator 12 of the present invention having an active layer of indium arsenide with an accumulation layer along the surface thereof has high magnetic field sensitivity and is capable of operating over a wide range of temperatures. Also, the indium arsenide layer is capable of being integrated with gallium arsenide circuits so that the Hall generator 12 can be completely integrated with a digital circuit for controlling or operating with the Hall generator.

Figure 3:
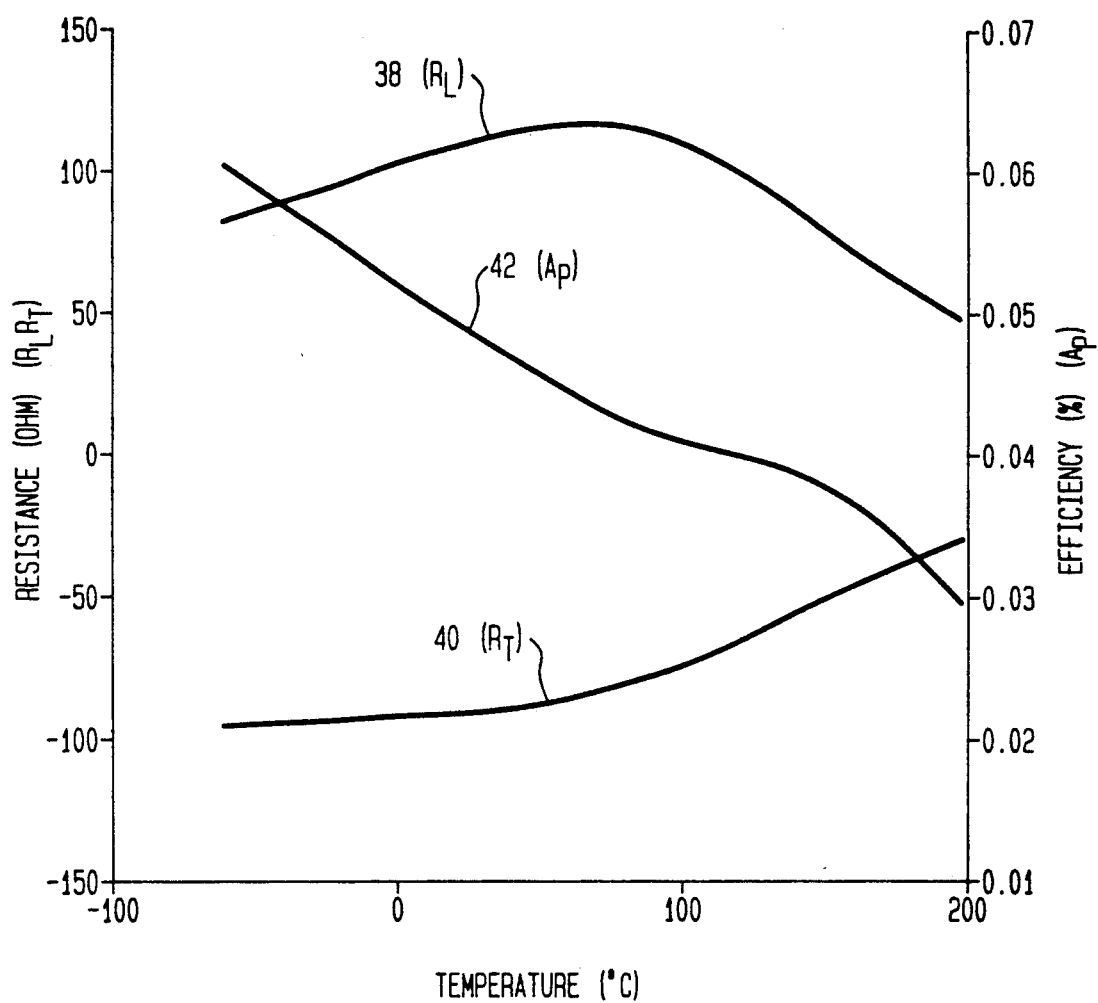
FIG. 3 is a graph showing the variation in resistance (left ordinate) and power efficiency (right ordinate) with changes in temperature (abscissa) for a Hall generator in accordance with the present invention.

FIG. 3 is a graph showing resistance in ohms $R_L R_T$ as left ordinate and power efficiency in percentage as right ordinate vs. temperature in °C. as the abscissa for a Hall generator of the present invention which was fabricated using the method described above. Line 38 shows variations in the longitudinal resistance $R_L$ with changes in temperature, where $R_L = V_L/I$ with $V_L$ being the longitudinal voltage and I being the current. Line 40 shows variations in the transverse resistance $R_T$ with changes in temperature, where $R_T = V_T/I$ with $V_T$ being the Hall voltage. $R_L$ was measured at zero field and $R_T$ was measured at a field of 1 Tesla. These lines show that the resistance of the device has relatively little change over a wide range of temperatures (i.e., over a temperature range of about 260° C., $R_L$ varied from about +50 ohms to about +120 ohms and $R_T$ varied from about −30 ohms to about −95 ohms). Line 42 shows variations in the maximum power efficiency $A_p$, assuming that the load is impedance matched to the Hall generator, measured at a field of 1 tesla. The power efficiency ($A_p$) is determined as follows:

$$A_p = R_T^2 R_{load}/(R_L^2 - R_T^2 + R_L R_{load}) (R_L R_{load})$$

where $R_{load} = (R_L^2 + R_T^2)^{\frac{1}{2}}$

Figure 4:
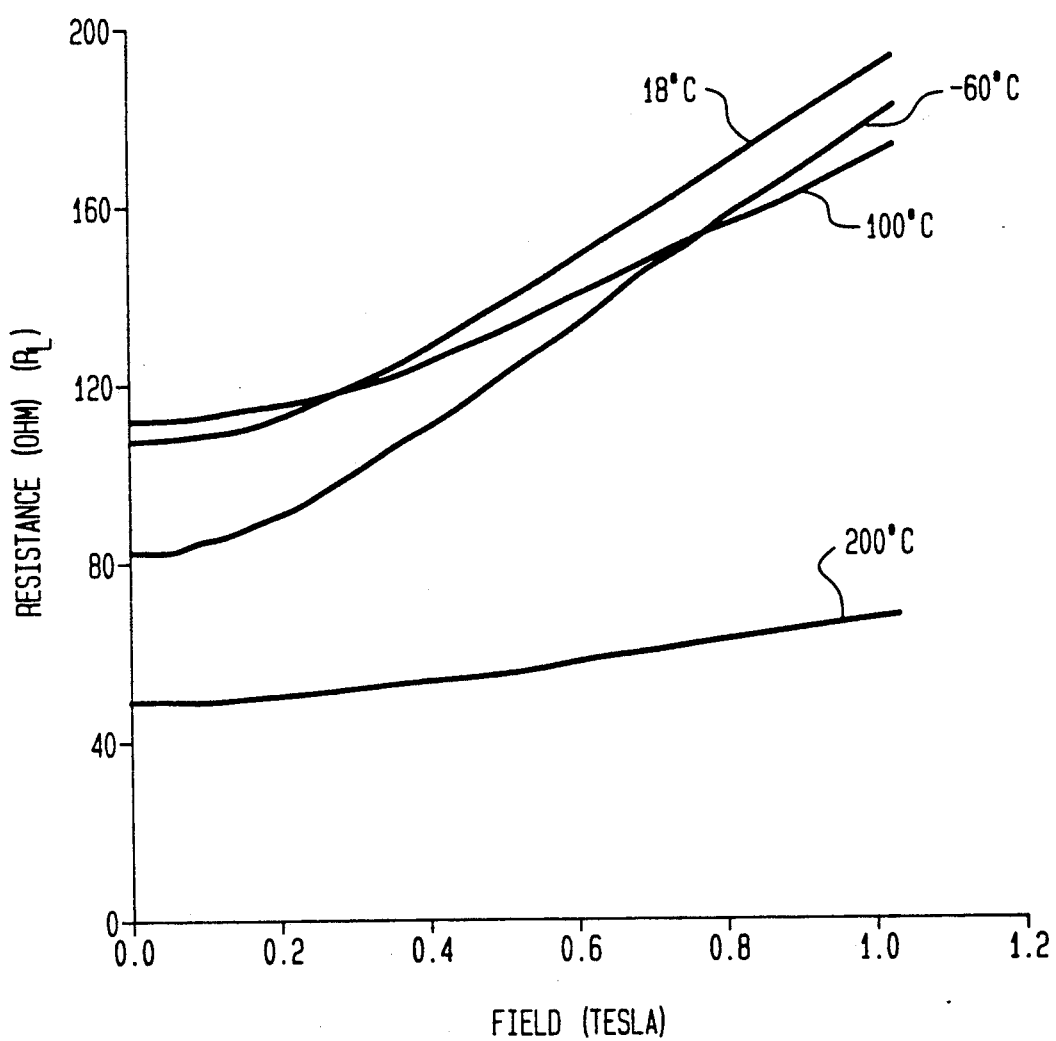
FIG. 4 is a graph showing the longitudinal resistance (ordinate) with changes in the magnetic field (abscissa) at different temperatures for a Hall generator in accordance with the present invention.
Figure 5:
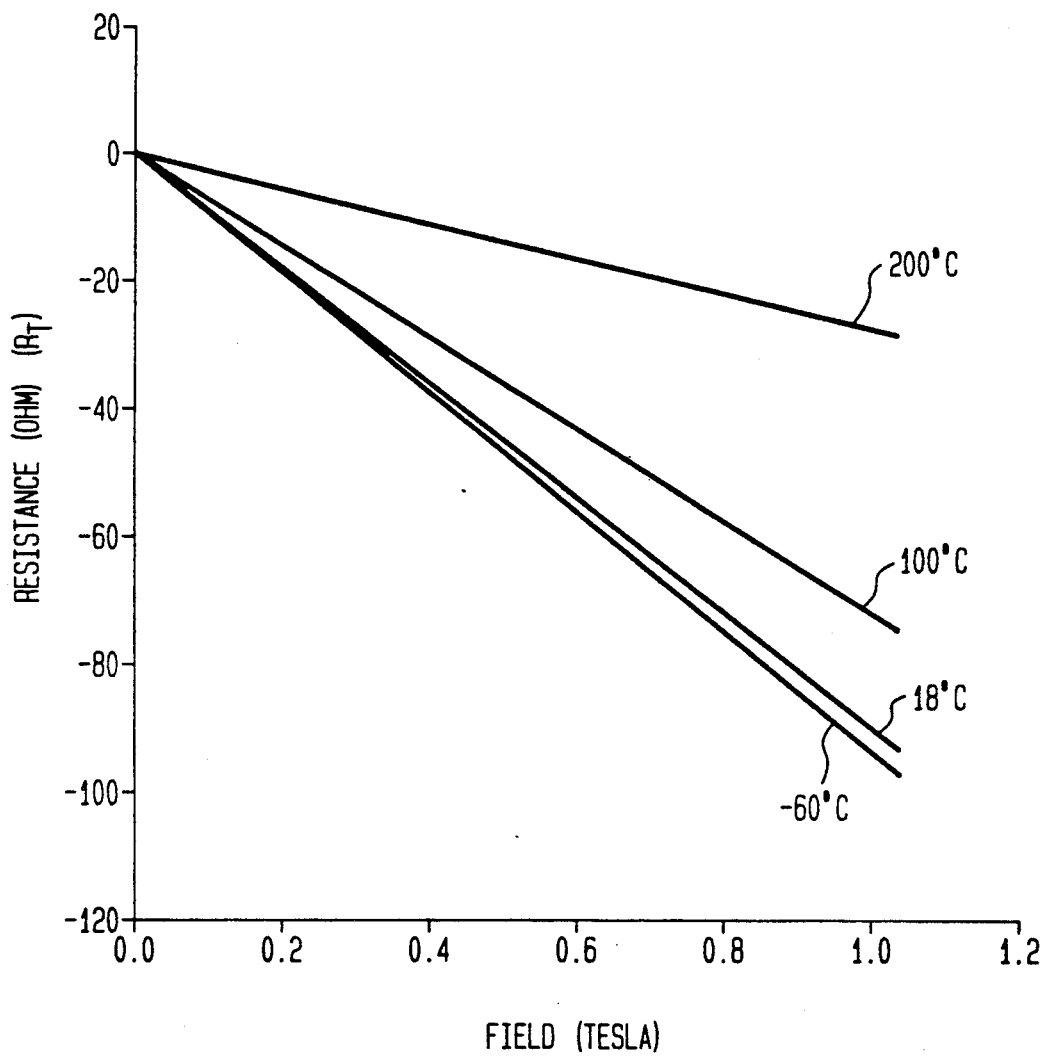
FIG. 5 is a graph showing the transfer resistance (ordinate) with changes in the magnetic field (abscissa) at different temperatures for a Hall generator in accordance with the present invention.

FIGS. 4 and 5 are graphs of the longitudinal resistance $R_L$ in ohms (FIG. 4) and the transverse resistance $R_T$ in ohms (FIG. 5) vs. the magnetic field (tesla) for a Hall generator of the present invention. Each line in each of these graphs shows the variation in resistance at a different temperature.

Figure 6:
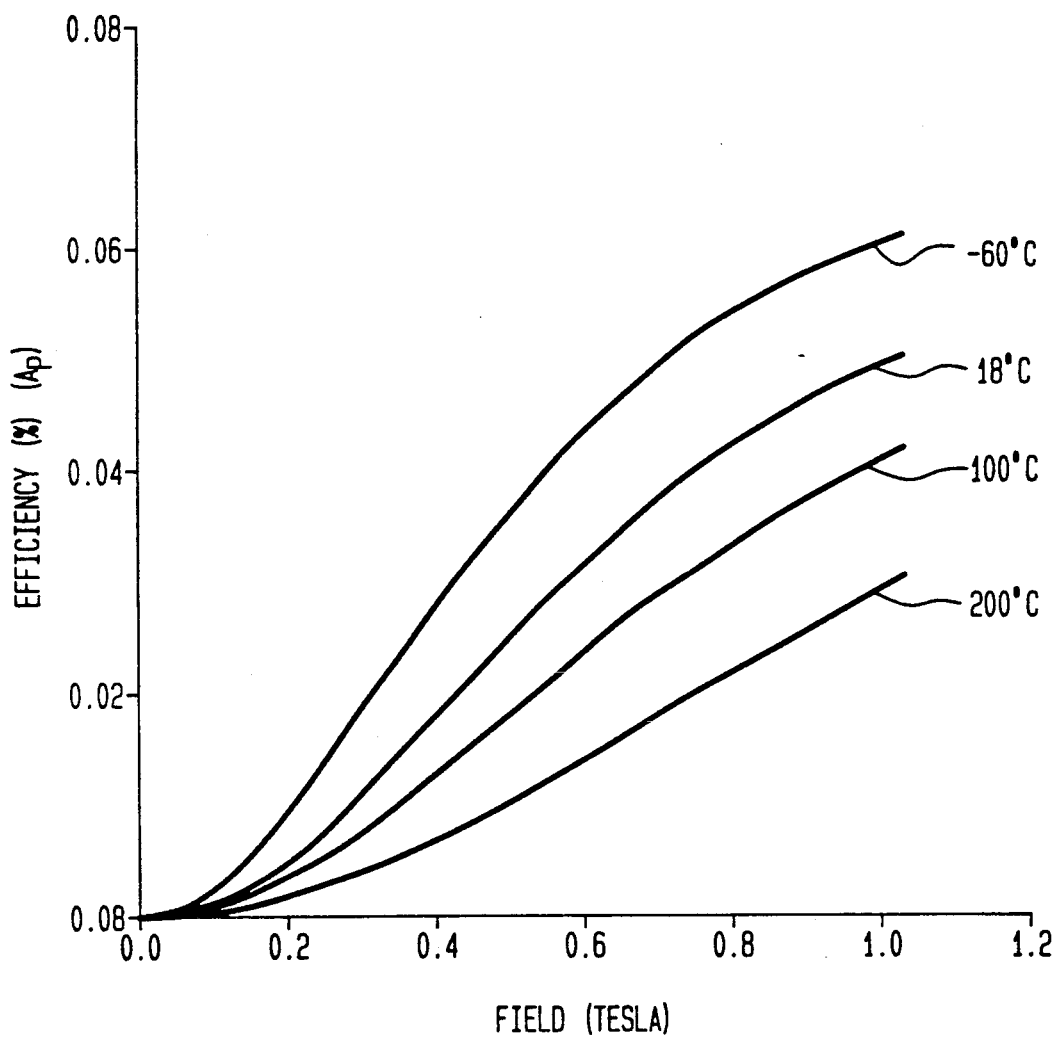
FIG. 6 is a graph showing the power efficiency (ordinate) with changes in the magnetic field (abscissa) at different temperatures for a Hall generator in accordance with the present invention.

FIG. 6 is a graph showing the power efficiency (ordinate) vs. the magnetic field (abscissa) with each line being at a different temperature for a Hall generator of the present invention. It can be seen from FIG. 6 that the efficiency increases with increasing field strength.

To determine the merits of the Hall generator of the present invention, its performance was compared to those of commercially available Hall generators. The information for this comparison was taken from the 1989 catalog of Siemens AG of Munich, Germany entitled, "Magnetic Sensors Data Book." The sensitivity to magnetic field is defined as $K_{BO}$, where $$K_{BO} = R_T/B(V/A \cdot T)$$

B is the magnetic field; V is the voltage; A is the power efficiency assuming an impedance matched load; and T is temperature. This formula is used to normalize away the field (B) since, for most Hall generators, $R_T$ is proportional to B. Since the catalog does not give $R_L(B)$ at all values of B, the comparison was normalized to $R_L(B=0)$. The following Table 1 provides the comparisons for $K_{BO}$, $R_L(B=0)$, $R_T(B=0)$ and $A_p$.

TABLE 1

| Siemens # | Material | $K_{BO}$ | $R_L$ | $R_T$ | $A_p$ |
|---|---|---|---|---|---|
| KSY10/13 | GaAs | 200 | 1050 | 1050 | 0.0089 |
| RHY10/11 | InAs | 0.7 | 2/3 | 1.6/2.6 | 0.035/0.015 |
| RHY15/20 | InSb | 9.6 | 30 | 30 | 0.024 |
| RHY17/18 | InAs | 6 | 30 | 30 | 0.0098 |
| SBV525 | InAs | 0.97 | 2.2 | 1.8 | 0.053 |
| SBV603 | InAs | 4.2 | 6.5 | 6.5 | 0.087 |
| SBV604 | InAs | 4.2 | 6.5 | 6.5 | 0.087 |
| SBV613 | InAs | 0.48 | 1.5 | 1.5 | 0.024 |
| SV231 | InAs | 7 | 38 | 32 | 0.0098 |
| TC21 | InAs | 0.6 | 1.2 | 1.2 | 0.055 |
| Inventive Device | | 91 | 107 | 100 | 0.15 |

From Table 1, it can be seen that the Hall generator in accordance with the present invention has a 70 percent improvement in efficiency over the next best Hall generator and is up to a factor of 22 better than most. It is believed that this improvement in the efficiency is a result of the presence of the strong accumulation layer at the surface of the indium arsenide layer and to the high electron mobility in the material.

It is to be appreciated and understood that the specific embodiments of the invention are merely illustrative of the general principles of the invention. Various modifications may be made consistent with the principles set forth. For example, the active layer may be of other configurations known for Hall generators and the contacts may be made of any well-known conductive material which makes good ohmic contact to indium arsenide. Still further, although only one field effect transistor is shown, the integrated circuit may include any number of such devices as is needed to form a desired circuit.

The embodiments of the invention in which an exclusive property or privilege is claimed are defined as follows:

1. A Hall generator comprising:
    a body having a surface, said body being of a semiconductor material which is semi-insulating;
    a layer of single crystalline indium arsenide on the surface of the body, the indium arsenide layer being of a thickness of no greater than about 5 micrometers and having four arms which are joined at a common point;
    a conductive contact on the free end of each of the arms of the indium arsenide layer; and
    an electron accumulation layer adjacent the outer surface of the indium arsenide layer and extending along the entire surface of the layer between the contacts, the accumulation layer having an electron density at least an order of magnitude higher than the average electron density of the indium arsenide layer and being effective to provide a magnetic sensitivity as if the indium arsenide layer were much thinner, and a range of operating temperatures as if the indium arsenide layer had a much higher electron density.

2. The Hall generator of claim 1 in which the indium arsenide layer is undoped.

3. The Hall generator of claim 2 in which the indium arsenide layer is of a thickness no greater than 3 micrometers.

4. The Hall generator of claim 2 in which the indium arsenide layer has a bulk density no greater than about $10^{16}$ electrons per cubic centimeter and a high average electron mobility of between 10,000 and 32,000 centimeters per volt per second.

5. The Hall generator of claim 1 in which the body is of a semi-insulating single crystalline member selected from the group consisting of gallium arsenide and indium phosphide.

6. The Hall generator of claim 5 in which the arms of the indium arsenide layer are substantially in the form of a cross.

7. The Hall generator of claim 5 further comprising at least one electrical device in the body at the surface thereof, the electron device being electrically connected to the Hall generator in a desired circuit.

8. The Hall generator of claim 7 in which the electrical device is a field effect transistor.

9. The Hall generator of claim 8 in which the field effect transistor comprises a region of one conductivity type in the body at the surface, a pair of spaced conductive contacts on the region and having ohmic contact therewith to form the source and drain of the field effect transistor, and a gate contact on the region between the source and drain contacts and forming a Schottky barrier junction with the region.

10. The Hall generator of claim 9 in which the region is of n-type conductivity.

11. A Hall generator sensor comprising:
a body of a semi-insulating single crystalline member selected from the group consisting of gallium arsenide and indium phosphide, said body having a surface;
a layer of single crystalline indium arsenide of a thickness no greater than about 5 micrometers on the surface of the body, said layer having a surface and also having four arms connected together and projecting from a common point;
a separate conductive contact on each of the arms of the indium arsenide layer at the free end of the arms;
an electron accumulation layer adjacent the surface of the indium arsenide layer and extending along the entire surface of the indium arsenide layer between the contacts, the accumulation layer having an electron density at least an order of magnitude higher than the average electron density of the indium arsenide layer and being effective to provide a magnetic sensitivity as if the indium arsenide layer were much thinner, and a range of operating temperatures as if the indium arsenide layer had a much higher electron density and electron mobility; and
at least one electrical device in the body at the surface, the electrical device being electrically connected to the contacts of the indium arsenide layer in a desired circuit.

12. The sensor of claim 11 in which the indium arsenide layer is undoped.

13. The sensor of claim 12 in which the indium arsenide layer is of a thickness no greater than 3 micrometers.

14. The sensor of claim 12 in which the indium arsenide layer has a bulk density no greater than about $10^{16}$ electrons per cubic centimeter and a high average electron mobility of between 10,000 and 32,000 centimeters per volt per second.

15. The sensor of claim 12 in which the arms of the indium arsenide layer are in the form of substantially a cross.

16. The sensor of claim 12 in which the electrical device is a field effect transistor.

17. The sensor of claim 16 in which the field effect transistor comprises a region of one conductivity type in the body at the surface, a pair of spaced conductive contacts on the region and having ohmic contact with the region to form the source and drain of the field effect transistor, and a gate contact on the region between the source and drain contacts and having a Schottky barrier junction with the region.

18. The sensor of claim 17 in which the region is of n-type conductivity.

19. A Hall generator sensor comprising:
a body of a single crystalline, semi-insulating member selected from the group consisting of gallium arsenide and indium phosphide, said body having a surface;
a layer of undoped single crystalline indium arsenide on the surface of the body having an outer surface and also having four arms joined at a common point to form a cross, the indium arsenide layer being of a thickness of no greater than 5 micrometers, having a bulk density no greater than about $5 \times 10^{16}$ electrons per cubic centimeter and a high average electron mobility of between 10,000 and 32,000 centimeters per volt per second;
a conductive contact on the free end of each of the arms of the indium arsenide layer;
an accumulation layer adjacent the outer surface of the indium arsenide layer and extending along the entire outer surface of the indium arsenide layer between the contacts, the accumulation layer having an electron density at least an order of magnitude higher than the average electron density of the indium arsenide layer and being effective to provide a magnetic sensitivity as if the indium arsenide layer were much thinner, and a range of operating temperatures as if the indium arsenide layer had a much higher electron density and electron mobility; and
at least one field effect transistor in the body and electrically connected to the contacts of the indium arsenide layer to form a desired circuit.

20. The sensor of claim 19 in which the indium arsenide layer is of a thickness of no greater than about 3 micrometers.

21. The sensor of claim 20 in which the field effect transistor comprises a region of n-type conductivity in the body at the surface, a pair of spaced conductive contacts on the region and having ohmic contact therewith to form the source and drain of the field effect transistor, and a gate contact on the region between the source and drain contacts and having a Schottky barrier junction with the region.

* * * * *